(12) United States Patent
Zhang et al.

(10) Patent No.: US 8,456,081 B2
(45) Date of Patent: Jun. 4, 2013

(54) ULTRABRIGHT FLUORESCENT OLEDS USING TRIPLET SINKS

(75) Inventors: Yifan Zhang, Ann Arbor, MI (US); Stephen R. Forrest, Ann Arbor, MI (US); Mark Thompson, Los Angeles, CA (US)

(73) Assignees: The University of Southern California, Los Angeles, CA (US); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/117,926

(22) Filed: May 27, 2011

(65) Prior Publication Data

US 2012/0001536 A1    Jan. 5, 2012

Related U.S. Application Data

(60) Provisional application No. 61/396,862, filed on Jun. 3, 2010, provisional application No. 61/398,627, filed on Jun. 29, 2010.

(51) Int. Cl.
*H01L 51/50* (2006.01)
*H01L 51/56* (2006.01)

(52) U.S. Cl.
USPC .............. 313/504; 313/503; 428/690; 445/25

(58) Field of Classification Search
USPC .................. 313/500–512; 428/690; 445/24, 445/25; 427/66
See application file for complete search history.

(56) References Cited

U.S. PATENT DOCUMENTS

| 7,264,889 B2 | 9/2007 | Kondakov et al. | |
| 7,279,704 B2 | 10/2007 | Walters et al. | |
| 2002/0028329 A1* | 3/2002 | Ise et al. | 428/336 |
| 2002/0127427 A1* | 9/2002 | Young et al. | 428/690 |
| 2003/0143427 A1* | 7/2003 | Matsuo et al. | 428/690 |
| 2004/0066139 A1* | 4/2004 | Hamada et al. | 313/506 |
| 2005/0095456 A1* | 5/2005 | Takeda | 428/690 |
| 2006/0040131 A1 | 2/2006 | Klubek | |
| 2007/0126347 A1* | 6/2007 | Jarikov et al. | 313/506 |

FOREIGN PATENT DOCUMENTS

| EP | 0961330 | 12/1999 |
| EP | 1383172 | 1/2004 |

OTHER PUBLICATIONS

Ruhstaller et al.,"Transient and steady-state behavior of space charges in multilayer organic light-emitting diodes", J. Appl. Phys. vol. 89(8): pp. 4575-4586, (2001).

Qi, et al., "Stacked white organic light emitting devices consisting of separate red, green, and blue elements." Appl. Phys. Lett. vol. 93(19): pp. 193306-1-193306-3 (2008).

(Continued)

*Primary Examiner* — Mariceli Santiago
(74) *Attorney, Agent, or Firm* — Morgan, Lewis & Bockius, LLP

(57) ABSTRACT

A first device is provided. The first device further comprises an organic light emitting device. The organic light emitting device further comprises an anode, a cathode, and an emissive layer disposed between the anode and the cathode. The emissive layer further comprises an organic host compound, an organic emitting compound capable of fluorescent emission at room temperature, and an organic dopant compound. The triplet energy of the dopant compound is lower than the triplet energy of the host compound. The dopant compound does not strongly absorb the fluorescent emission of the emitting compound.

18 Claims, 11 Drawing Sheets

OTHER PUBLICATIONS

Giebink, et al., "Temporal response of optically pumped organic semiconductor lasers and its implication for reaching threshold under electrical excitation", Phys. Rev. B. vol. 79: pp. 073302-1-073302-4, (2009).

Ma et al., "Time-resolved transient electroluminescence measurements of emission from DCM-doped Alq3 layers", Chemical Physics Letters, vol. 397, pp. 87-90 (2004).

Ruhstaller et al., "Simulating Electronic and Optical Processes in Multilayer Organic Light-Emitting Devices", IEEE Journal of Selected Topics in Quantum Electronics, vol. 9(3): pp. 723-731, (2003).

Gu et al., "High-external-quantum-efficiency organic light-emitting devices", Opt. Lett., vol. 22, Issue 6, 396-398 (1997).

Moller et al., "Improved light out-coupling in organic light emitting diodes employing ordered microlens arrays", J. Appl. Phys., vol. 91, p. 3324 (2002).

Tsutsui et al., "Doubling Coupling-Out Efficiency in Organic Light-Emitting Devices Using a Thin Silica Aerogel Layer", Advanced Materials, vol. 13, Issue 15, pp. 1149-1151 (2001).

Madigan et al., "Improvement of output coupling efficiency of organic light-emitting diodes by backside substrate modification", Appl. Phys. Lett., vol. 76, p. 1650 (2000).

Slootsky et al., "Full-wave simulation of enhanced outcoupling of organic light-emitting devices with an embedded low-index grid", Appl. Phys. Lett., vol. 94, pp. 163302-1-163302-3, (2009).

Hosokawa et al., "Transient behavior of organic thin film electroluminescence", Appl. Phys. Lett., vol. 60 (10), pp. 1220-1222, (1992).

Kozlov et al., "Optical Properties of molecular organic semiconductor thin films under intense electrical excitation", Appl. Phys. Lett., vol. 74 (8), pp. 1057-1059, (1999).

Das et al., "Transient electroluminescence under double voltage pulse: Charge accumulation in light-emitting devices based on alizarin violet", Appl. Phys. Lett., vol. 76 (13), pp. 1770-1772, (2000).

Hassine et al., "Transient response of a bilayer organic electroluminescent diode: Experimental and theoretical study of electroluminescence onset", Appl. Phys. Lett., vol. 78(8), pp. 1053-1055, (1992).

Young et al., "Current-induced fluorescence quenching in organic light-emitting diodes", Appl. Phys. Lett., vol. 80 (5), pp. 874-876, (2002).

Shi et al., "Antracene derivatives for stable blue-emitting organic electroluminescence devices", Appl. Phys. Lett., vol. 80 (17), pp. 3201-3203, (2002).

Okumoto et al., "Green fluorescent organic light-emitting device with external quantum efficiency of nearly 10%," Appl. Phys. Lett., vol. 89, pp. 063504-1-063504-3, (2006).

Matsushima et al., "Suppression of exciton annihilation at high current densities in organic light-emitting diode resulting from energy-level alignments of carrier transport layers", Appl. Phys. Lett., vol. 92, pp. 063306-1-063306-3, (2008).

Luo et al., "Electron-Induced Quenching of Excitons in Luminescent Materials", Chem. Mater., vol. 19, p. 2288-2291 (2007).

Tang et al., "Electroluminescence of doped organic thin films", Appl. Phys 85(9), pp. 3610-3616, (1989).

Nikitenko et al., "The overshoot effect in transient electroluminescence from organic bilayer light emitting diodes: Experiment and theory", J. Appl. Phys., vol. 81(11), pp. 7515-7525, (1997).

Pinner et al., "Transient electroluminescence of polymer light emitting diodes using electrical pulses", J. Appl. Phys., vol. 86(9), pp. 5116-5130, (1999).

Adachi et al., "Nearly 100% internal phosphorescence efficiency in an organic light emitting device", J. Appl. Phys., vol. 90(10), pp. 5048-5051, (2001).

Goushi et al., "Triplet exciton confinement and unconfinement by adjacent hole-transport layers", J. Appl. Phys., vol. 95(12), pp. 7798-7802, (2004).

Gärtner et al., "The influence of annihilation processes on the threshold current density of organic laser diodes", J. Appl. Phys, vol. 101, pp. 023107-1-023107-9, (2007).

Kondakov et al., "Triplet annihilation exceeding spin statistical limit in highly efficient fluorescent organic light-emitting diodes", J. Appl. Phys., vol. 106, pp. 124510-1-124510-7, (2009).

Köhler et al., "Triplet states in organic semiconductors", Mat. Sci. & Eng. R, vol. 66, pp. 79-109, (2009).

Baldo et al., "Excitonic singlet-triplet ratio in a semiconducting organic thin film", Phys. Rev. B., vol. 60(20), pp. 14 422-14 428, (1999).

Baldo et al., "Prospects for electrically pumped organic laser", Phys. Rev. B., vol. 66, pp. 035321-1-035321-16, (2002).

Tanaka et al., "Observation of phosphorescence from tris(8-hydroxyquinoline) aluminum thin films using triplet energy transfer from iridium complexes", Phys. Rev. B, vol. 71, pp. 205207-1-205207-6, (2005).

Giebink et al., "Quantum efficiency roll-off at high brightness in fluorescent and phosphorescent organic light emitting diodes", Phys. Rev. B, vol. 77, pp. 235215-1-235215-9 (2008).

Fourny et al., "Single-Triplet Interactions in Crystalline Anthracene", Phys. Rev. Lett., vol. 21(15), pp. 1085-1088 (1968).

Müchl et al., "Transient electroluminescence measurements on organic heterolayer light emitting diodes", Synthetic Metals, vol. 111-112, pp. 91-94 (2000).

U.S. Appl. No. 61/396,862, filed Jun. 3, 2010.

U.S. Appl. No. 61/398,627, filed Jun. 29, 2010.

Tessler, N., Denton, G. J. & Friend, R. H. *Lasing from conjugated-polymer microcavities. Nature* 382, 695-697 (1996).

Bulovic, V., Kozlov, V. G., Khalfin, V. B. & Forrest, S. R. *Transform-limited, narrow-linewidth lasing action in organic semiconductor microcavities. Science* 279, 553-555, (1998).

Kozlov, V. G. et al. *Structures for organic diode lasers and optical properties of organic semiconductors under intense optical and electrical excitations. Ieee Journal of Quantum, Electronics* 36, 18-26 (2000).

Lehnhardt, M., Riedl, T., Weimann, T. & Kowalsky, W. *Impact of triplet absorption and triplet-singlet annihilation on the dynamics of optically pumped organic solid-state lasers. Phys. Rev. B*81, 16206 (2010).

Schafer, F. P. *Dye Lasers.* (Springer, 1990), p. 52-59.

Snavely, B. B. *Flashlamp-excited organic dye lasers. Proceedings of the IEEE* 57, 1374-1390, (1969).

Schols, S., Kadashchuk, A., Heremans, P., Helfer, A. & Scherf, U. *Triplet Excitation Scavenging in Films of Conjugated Polymers. ChemPhysChem* 10, 1071-1076 (2009).

Bornemann, R., Lemmer, U. & Thiel, E. *Continuous-wave solid-state dye laser. Opt. Lett.* 31, 1669-1671 (2006).

Kozlov, V. G. et al. *Study of lasing action based on Forster energy transfer in optically pumped organic semiconductor thin films. J. Appl. Phys.* 84, 4096-4108 (1998).

Carroll, J., Whiteaway, J. & Plumb, D. *Distributed feedback semiconductor lasers.* (The Institution of Electrical Engineers, 1998,) pp. 128-129.

Zhang, Y., Whited, M., Thompson, M. E. & Forrest, S. R. *Single-triplet quenching in high intensity fluorescent organic light emitting diodes. Chem. Phys. Lett.* 495, 161-165 (2010).

Lehnhardt, M., Riedl, T., Rabe, T. & Kowalsky, W. *Room temperature lifetime of triplet excitons in fluorescent host/guest systems. Org. Electron.* 12, 486-491 (2011).

Rijn, C. J. M. v. *Laser interference as a lithographic nanopatterning tool. Journal of Microlithography, Microfabrication, and Microsystems* 5, 011012 (2006).

Turro, N. J. *Modern Molecular Photochemistry.* (University Science Books, 1991).

Rabe, et al., Appl. Phys. Lett. 89 (8), 081115 (2006).

Lehnhardt, et al. Org. Electron. 12 (8), 1346-1351 (2011).

Kozlov et al., "Laser action in organic semiconductor waveguide and double-heterostructure devices", Nature 389, p. 362-364 (1997).

Samuel et al., Organic Semiconductor Lasers, Chem. Rev. 107, 1272-1295(2007).

Hamada Yuji, et al. "Red Organic Light Emitting Diodes Using an Emitting Assist Dopant," Applied Physics Letters, AIP American Institute of Physics, Melville, NY, US, vol. 75, No. 12, Sep. 20, 1999, pp. 1682-1684.

International Search Report corresponding to the PCT/US2011/039138 application, dated Jul. 10, 2011.

Y. Zhang, M. Slootsky, and S. R. Forrest, Appl. Phys. Lett. 99 223303 (2011).

M. A. Baldo, and S. R. Forrest, Phys. Rev. B 62 10958 (2000).

I. Tanaka, Y. Tibata, and S. Tokito, Phys. Rev. B 71 205207 (2005).

W. G. Herkstroeter, and P. B. Merkel, Journal of Photochemistry 16 331 (1981).

R. H. Clarke, and R. M. Hochstrasser, J. Mol. Spectrosc, 32 309 (1969).

D. F. Evans, Journal of the Chemical Society (Resumed) 1351 (1957).

P. McGlynn, T. Azumi, and M. Kasha, The Journal of Chemical Physics 40 507 (1964).

* cited by examiner

ULTRABRIGHT FLUORESCENT OLEDS USING TRIPLET SINKS

This application claims priority to, and the benefit of, U.S. Provisional Application Ser. No. 61/396,862, entitled Ultrabright fluorescent OLEDs using phosphor triplet sinks, filed Jun. 3, 2010, and U.S. Provisional Application Ser. No. 61/398,627, entitled Ultrabright fluorescent OLEDs using phosphor triplet sinks, filed Jun. 29, 2010.

This invention was made with government support under DE-5C0001013 and DE-EE0000626 awarded by the Department of Energy. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices with improved properties.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors.

More details on OLEDs can be found in U.S. Pat. No. 7,279,704, which is incorporated herein by reference in its entirety.

Various ways to deposit the organic materials used to fabricate organic devices are known, such as vacuum thermal evaporation, solution processing, organic vapor phase deposition, and organic vapor jet printing.

SUMMARY OF THE INVENTION

A first device is provided. The first device further comprises an organic light emitting device. The organic light emitting device further comprises an anode, a cathode, and an emissive layer disposed between the anode and the cathode. The emissive layer further comprises an organic host compound, an organic emitting compound capable of fluorescent emission at room temperature, and an organic dopant compound. The triplet energy of the dopant compound is lower than or equal to the triplet energy of the host compound. The triplet energy of the organic dopant compound is lower than or equal to the triplet energy of the organic emitting compound. The singlet energy of the organic emitting compound is lower than the singlet energy of the organic host compound. The singlet energy of the organic emitting compound is lower than the singlet energy of the organic dopant compound. The dopant compound does not strongly absorb the fluorescent emission of the emitting compound.

The first device preferably further includes a hole transport layer disposed between the emissive layer and the anode, and an electron transport layer disposed between the emissive layer and the cathode. The organic dopant compound is preferably present only in the emissive layer.

Preferably, the transport gap of the dopant compound is no less than the transport gap of the host compound.

Preferably, the mobility of the dopant compound is higher than the mobility of the host compound.

Preferably, the triplet decay time of the dopant compound is shorter than the triplet decay time of the emitting compound.

Preferably, the first device further comprises an outcoupling enhancement structure adapted to increase the amount of light outcoupled from the first device by at least 25% relative to a device having no outcoupling enhancement structure.

Preferably, the concentration of the dopant compound is 10%-90%, and the concentration of the emitting compound is 0.5%-5%.

In some embodiments, the triplet energy of the dopant compound is preferably greater than 1.3 eV, and more preferably greater than 1.6 eV.

Preferably, the organic light emitting device has a turn-on peak that is at least 50% reduced relative to an otherwise equivalent device that omits the dopant compound. More preferably, the organic light emitting device does not have a turn-on peak.

Preferably, the organic emitting compound is capable of fluorescent emission at room temperature.

Preferably, the dopant compound has a triplet energy less than 1.7 eV, and has a singlet energy that is at least twice the triplet energy.

Preferably, the dopant compound is selected from the group consisting of: anthracene, tetracene, rubrene, and perylene and their derivatives.

In some embodiments, the dopant compound may be a phosphor.

In some embodiments, the first device is a consumer product.

A method is provided. The method is practiced using a first device that further comprises an organic light emitting device. The organic light emitting device further comprises an anode, a cathode, and an emissive layer disposed between the anode and the cathode. The emissive layer further comprises an organic host compound, an organic emitting compound capable of fluorescent emission at room temperature, and an organic dopant compound. The triplet energy of the dopant compound is lower than or equal to the triplet energy of the host compound. The triplet energy of the organic dopant compound is lower than or equal to the triplet energy of the organic emitting compound. The singlet energy of the organic emitting compound is lower than the singlet energy of the organic host compound. The singlet energy of the organic emitting compound is lower than the singlet energy of the organic dopant compound. The dopant compound does not strongly absorb the fluorescent emission of the emitting compound. An operating voltage is applied across the anode and the cathode. The concentration of the dopant compound is sufficient to reduce the turn-on peak of the organic light emitting device by at least 50% relative to an otherwise equivalent device that omits the dopant compound. Preferably, the organic light emitting device does not have a turn-on peak.

BRIEF DESCRIPTION OF THE DRAWINGS

FIG. 10 shows light output as a function of time after the devices of FIG. 7 are turned on.

DETAILED DESCRIPTION

Figure 1:
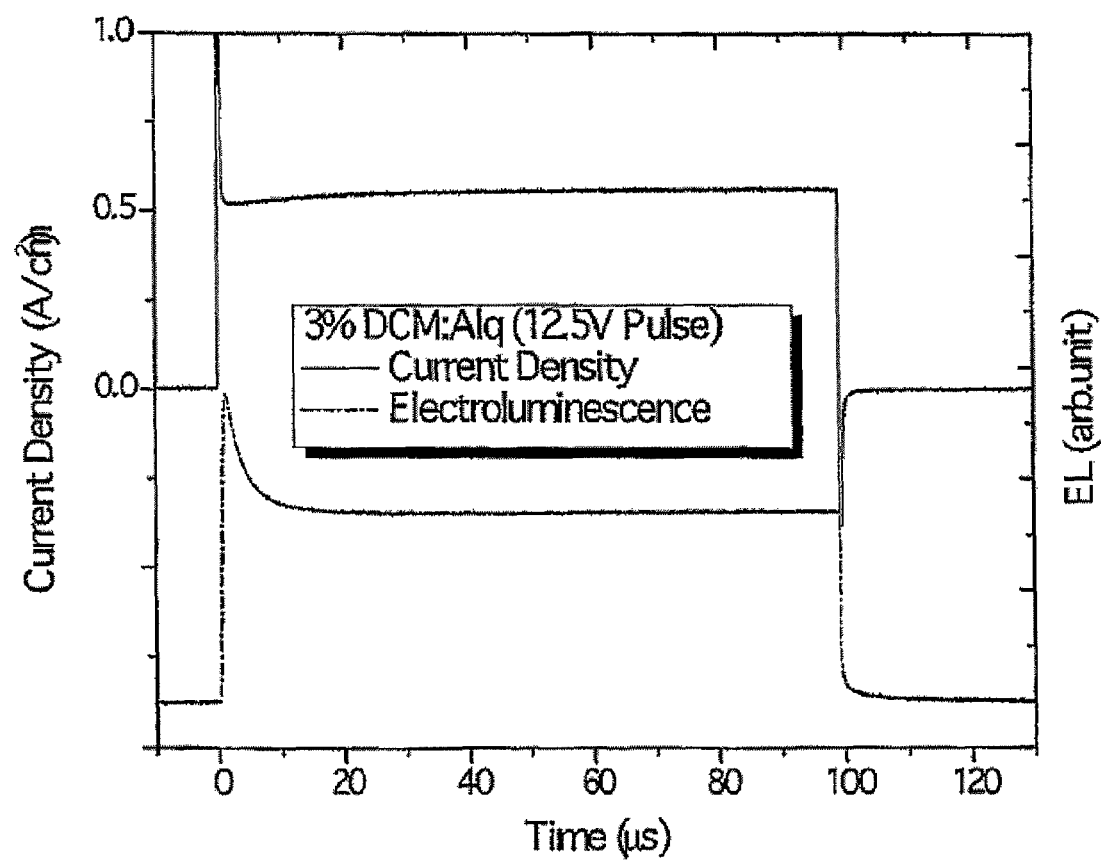
FIG. 1 shows the transient response of a device to a rectangular pulse.

A significant overshoot in the EL turn on transient is due to singlet-triplet annihilation, which quenches the emission within 1 microsec (typically) of the current pulse. Therefore, eliminating the overshoot should result in an increased emission. One way to do this is to lightly dope the EML with a dopant, possibly a phosphor or other material, whose triplet energy is lower than or equal to that of the host in the fluorescent OLED. This decreases triplet buildup, thereby increasing brightness and efficiency of the device. These effects are important in achieving ultrahigh brightness as desired for white light sources and other uses.

Electroluminescence (EL) transient turn-on peaks with nearly twice the brightness of the steady state EL are observed in fluorescent organic light emitting diodes with doped emission layer. By modeling both singlet and triplet population dynamics, we identify the EL drop after the peak as due to singlet-triplet (ST) quenching. The peak recovery under the double pulse driving mode is explained in terms of triplet population relaxation following triplet-triplet (TI) quenching. These results confirm the role of triplets as singlet quenchers, which contributes to the EQE roll-off at high brightness in fluorescent OLEDs.

Although the peak efficiency of fluorescent organic light emitting diodes (OLEDs) is much lower than phosphorescent OLEDs, the nanosecond singlet lifetime results in smaller efficiency roll-off when increasing the current density. Therefore, fluorescent OLEOs can become competitive with phosphorescent OLEDs at high brightness and it is important to understand the quenching mechanism of singlets.

Singlet-polaron quenching and charge imbalance have been found to be responsible for EQE roll-off in fluorescent OLEDs, but the role of triplets has long been neglected despite their large population. The recent demonstration of EQE in fluorescent OLEDs far exceeding the spin statistical limit has been explained by additional singlets result from triplet-triplet (TT) quenching. However, the effect of triplets can be twofold; TT quenching can raise EQE by producing singlets, while singlet-triplet (ST) quenching can lower EQE by destroying singlets. In the latter case, one singlet transfers its energy to a triplet exciting it to a higher triplet excited state.

Herein, transient electroluminescence (EL) is used to study the role singlet-triplet (ST) quenching in fluorescent OLEDs.

Transient EL measurements are realized by applying rectangular voltage pulses to the OLEDs and measuring the EL response with a fast photo detector. This technique has been successfully used to study both turn-on and turn-off behavior of OLEDs. Upon current injection to the emission layer (EML) of an OLED, singlet population rises on a nanosecond time scale determined by singlet lifetime while triplet population increase takes a much longer time. If strong ST quenching is present, there should be an EL turn-on peak due to the initial singlet population followed by a slow decay, which is caused by the build-up of triplets as singlet quenchers.

Turn-on peaks in OLEDs have indeed been observed previously and attributed to transient charge imbalance or recombination of pre-trapped charges. However, these studies offer phenomenological explanation rather than a rigorous treatment of the behavior. By modeling both singlet and triplet population, we aim at a quantitative explanation of the EL transient turn-on peak and its effect on steady state EQE in fluorescent OLEDs. DCM doped Alq, and TBP doped ADN OLEDs with different doping concentrations are used as examples. Theory on singlet and triplet population dynamics is provided in section 2. Section 3 covers the experimental details. Results from EL transient measure together with the fits to the model are given in section 4, which includes the comparison between a model discussed herein and previous explanations of turn-on peaks in OLEDs. Conclusions are drawn in section 5.

2. THEORY

To study the interaction between singlet and triplet, their populations need to be calculated simultaneously. In fluorescent OLEDs, triplet population dynamics are determined by three processes: triplet nonradiative decay, TT quenching, and triplet-polaron (TP) quenching. TT quenching occurs through two routes,

$$T^* + T^* \rightarrow S^* + S^0, \quad (1)$$

and

$$T^* + T^* \rightarrow T^* + S^0, \quad (2)$$

where $T^*$ is the triplet excited state, $S^*$ is the singlet excited state, and $S^0$ is the singlet ground state. By the spin statistics, the probability of (1) is ⅓ of (2). Therefore, when two triplets annihilate, the net result is ¾ triplet excited state, ¼ singlet excited state and 1 singlet ground state. TP quenching is described by, $$T^* + n \rightarrow S^0 + n^*, \quad (3)$$

where n is the polaron ground state and $n^*$ is the polaron excited state. In principle, the polaron in (3) includes both injected charge determined by current density and interfacial stored charge determined by the capacitance of the OLED as well as applied voltage. Since TP quenching is a collision type interaction and the collision probability of triplets with free carriers is much larger than with interfacial charge, the latter is neglected. The free carrier population is given by the Langevin recombination,

$$\frac{dn}{dt} = \frac{J(t)}{ed} - \gamma n^2, \quad (4)$$

where J(t) is the current density flowing through the electrodes, d is the width of the exciton formation region, which can be approximated by the width of the EML, and y is the Langevin recombination rate, $$\gamma = \frac{e}{\varepsilon_r \varepsilon_0}(\mu_h + \mu_e). \quad (5)$$

where $\varepsilon_r$ is the relative permittivity of the EML, $\varepsilon_0$ is the permittivity of vacuum, $\mu_h$ and $\mu_e$ are the mobilities of holes and electrons in the EML respectively. It should be noted that (4) neglects the charge transit time from electrodes to EML or, equivalently, (4) does not include the displacement current during the turn-on of the device. A treatment of the charge injection and transit can be found in Ruhstaller, B., S A Carter, S. Barth, H. Riel, W. Riess, and J. C. Scott. J. Appl. Phys., 2001. 89(8): p. 4575. The approximation described herein simplifies the mathematics and allows an analytical treatment of the problem.

According to (1), (2), (3), and (4), the full triplet population dynamics are given by, $$\frac{dT^*}{dt} = -\frac{3}{4}\gamma n^2 - k_T T^* - \frac{5}{4}k_{TT}T^{*2} - k_{TP}nT^*, \quad (6)$$

where $k_T$ is the triplet nonradiative decay rate, $k_{TT}$ is the TT quenching rate, $k_{TP}$ is the TP quenching rate. The factors of ¾ and 5/4 come from the spin statistics of triplet generation and TT quenching respectively. The generation of excitons follows the Langevin recombination of free carriers.

On the other hand, singlet population is assumed to follow two processes: singlet decay (both radiative and nonradiative) and ST quenching. ST quenching occurs through, $$S^* + T^* \rightarrow T^{**} + S^0, \quad (7)$$

where T** is the second or higher triplet excited state. This interaction can be efficient if the absorption of T* overlaps the emission of S*. It has previously been demonstrated by optical pumping of doped organic films that guest singlet quenching by host triplet is efficient in DCM doped Alq$_3$ and BCz-VBi doped CBP.

According to (1), (4), and (7), the full singlet population dynamics are given by, $$\frac{dS^*}{dt} = \frac{1}{4}\gamma n^2 - k_S S^* - \frac{1}{4}k_{TT}T^{*2} - k_{ST}S^*T^*, \quad (8)$$

where $k_S$ is the singlet decay rate and $k_{ST}$ is the ST quenching rate. The two factors of ¼ come from spin statistics similar to (6).

3. EXPERIMENT

All OLEDs were grown on commercial indium-tin-oxide (ITO) coated glass substrate cleaned and treated following the procedure described elsewhere in Qi, X., M. Slootsky, and S. Forrest, Appl. Phys. Lett., 2008. 93(19): p. 193306. Organic layers are deposited in a vacuum thermal evaporator with base pressure less than $5\times10^{-7}$ Torr A 40 nm thick 4,4'-bis[N-(1-naphthyl)-N-phenyl-amino]-biphenyl (NPD) layer was first deposited as the hole transporting layer (HTL), followed by a 25 nm thick emission layer (EML), and a 30 nm thick bis{2-methyl-8-quinolinolate)-4-(phenylphenolato)aluminum (BAlq) electron transporting layer (ETL). 4-dicyanmethylene-2-methyl-6-(p-dimethylaminostyryl)-4H-pyran (DCM) doped tris(8-hydroxyquinoline) aluminum (Alq$_3$) and 2,5,8,11-Tetra-tert-butylperylene (TBP) doped 9,10-Di(naphth-2-yl)anthracene (ADN) are used for EML. The four OLEDs studied consist of the following EML: 3% vol DCM:Alq3 (A1), 8% vol DCM:Alq3 (A2), 3% TBP:ADN (B1), and 8% TBP:ADN (B2). All devices were completed with 0.8 nm thick LiF followed by 80 nm thick aluminum as cathode to form 1 mm² square devices.

After deposition, current-voltage-luminance (IVL) characteristic of the OLED was immediately measured by an HP4155 parameter analyzer with a calibrated Si photodiode in atmosphere. The integration time for each voltage step was 17 ms. Then, the device was loaded into a N$_2$ chamber where transient EL was conducted. Rectangular voltage pulses were generated by a HP8114A pulse generator at a repetition rate of 5 Hz and pulse width of 100 μs. Emission was collected by a 10 MHz avalanche photodiode (APD, Hamamatsu C5460). The signal from the APD was monitored by an oscilloscope (Tektronicx 3054B) which also measured the current and voltage on the OLED. A typical transient measurement is shown in FIG. 1 for device A1.

The singlet lifetime of the fluorescent dopants were measured by transient photoluminescence (PL) from 50 nm thick doped films. The output from a N$_2$ laser was focused to a 1 mm size spot (337 nm wavelength, 800 ps pulse width) on the film and the transient PL was collected by a streak camera (Hamamatsu C4334).

4. RESULT AND DISCUSSION

4.1 Transient Electroluminescence Turn-On Peaks

Figure 2:
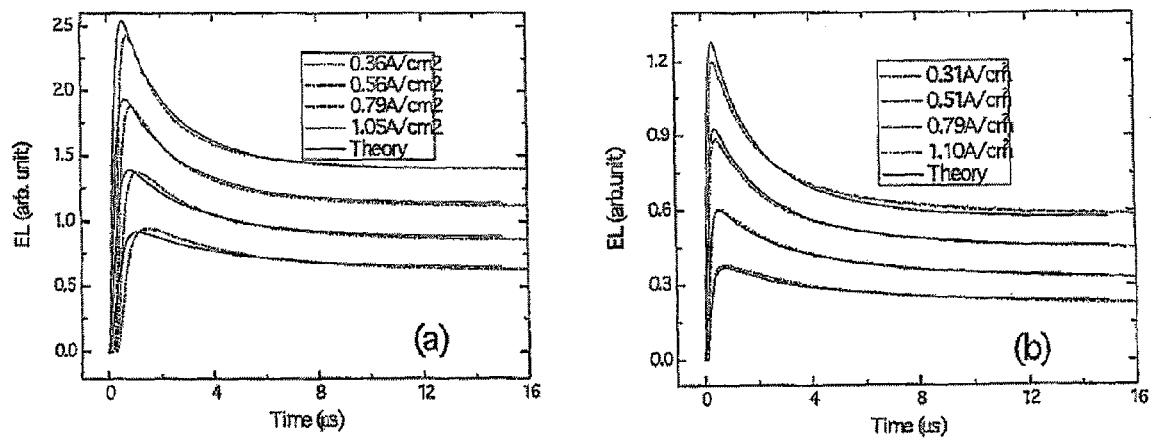
FIG. 2 shows the transient responses of two devices in response to voltage pulses of different amplitudes

All of the four devices show EL turn-on peaks. FIG. 2 shows the turn-on peak behavior for devices A1 and B2 with varying pulse amplitudes. It can be seen that the ratio of peak to steady state EL increases with driving voltage (current). Also, the initial rise time<1 μs) is much shorter than the subsequent decay (about 20 μs).

In principle, equations (4), (6), and (8) fully describe the EL behavior and could be used to extract physical constants. However, there are five unknown parameters, including $\mu$, $k_T$, $k_{TP}$, $k_{TT}$, and f$k_{ST}$. Although 3 processes are included in (6), they may not be equally effective. Since none of the materials used in this letter has strong spin-orbit coupling, they have long triplet lifetimes [24] allowing us to neglect $k_T$ in (6). Also, as will become evident in section 4.2 from double pulse peak recovery measurement, TT quenching is not efficient during the device turn-on and can also be neglected.

Since the exciton formation region of both DCM:Alq$_3$ and TBP:ADN are located at the interface of HTL and EML, the electron mobilities of Alq$_3$ and ADN are expected be higher than the hole mobilities and we can include only the electron mobility in (5). If we further assume the EML has similar electron mobility as ETL, an approximate value of electron mobility $\mu_e$ in EML can be calculated from the EL turn-on delay by

$$\mu_e = d^2/\tau V' \quad (9)$$

where d is the sum of EML and ETL thicknesses (55 nm in our case), V is the pulse voltage and τ is the turn-on delay, which is given by the difference between the leading edge of the voltage pulse and turn-on of the EL. The electric field dependence of the mobility is not included because of the small voltage range (10V-13V). Although the systematic error of (9) can be as large as 50% since electron mobilities in EML and ETL may not be similar, it can be seen from (4), (5), and (6) that $k_{TP}$ is proportional to the square root of $\mu_e$, so the error in $k_{TP}$ is scaled to approximately 20%, whereas $k_{ST}$ is unaffected by the error of $\mu_e$.

Table. 1 summarizes the fit parameters used for all four devices and two examples are provided in FIG. 2. For each device, we assume $k_{TP}$ and $k_{ST}$ are independent pulse amplitudes, while the current densities in (4) are the measured values of the transient current. The steady state current density range for the model fit is 0.1 A/cm²-1 A/cm², where the EL peaks is prominent. The predicted EL deviates from the experiment for the first 1 µs after turn-on because of the neglect of charge transit time in (4).

Figure 3:
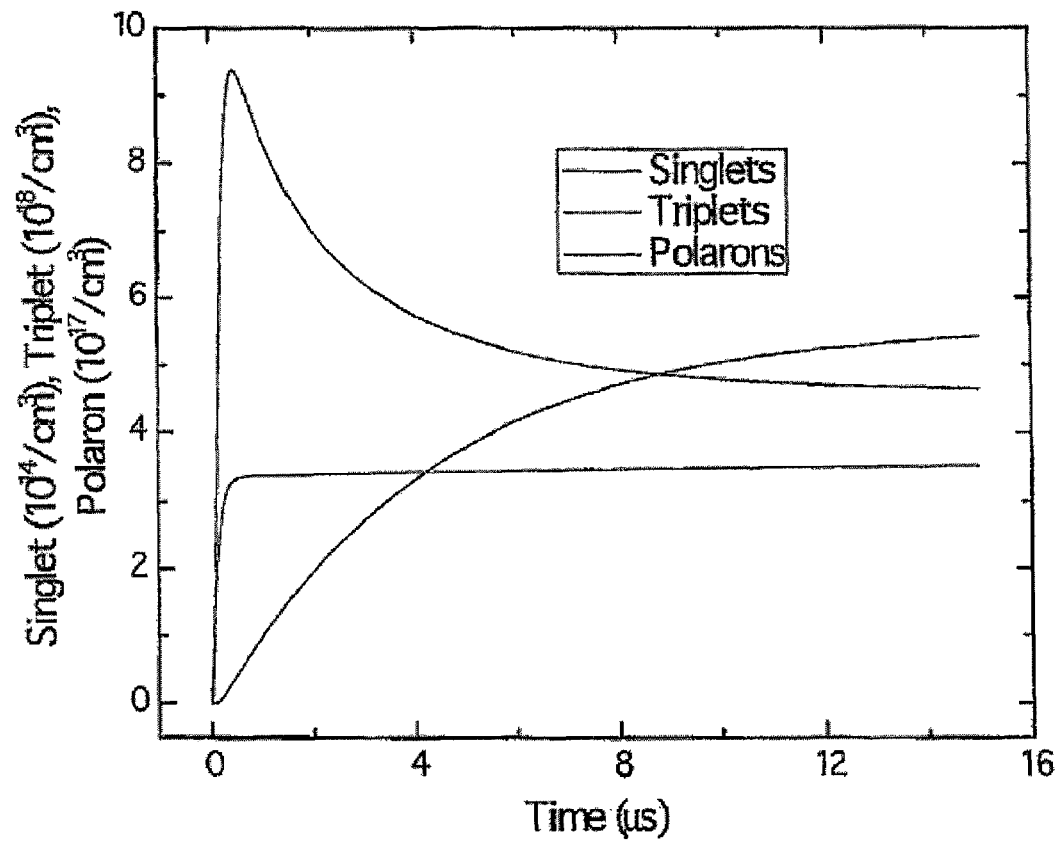
FIG. 3 shows simulated population dynamics of a device at steady state current density

To explain the physical reason for the turn-on peaks, in FIG. 3, we plot the simulated population of singlets, triplets, and polarons for device B2 using the parameters from Table 1. Upon current injection, polaron population n reaches equilibrium in less than 0.7 µs. Then, according to (6), the effective triplet lifetime, set by $k_{TP}$n, governs the triplet dynamics. Initially, before triplet population has accumulated, singlet population dynamics are determined by the decay constant $k_S$. As triplet population increases, ST quenching becomes a competing process, suppressing the increase of singlet population. This results in a peak in singlet population. As triplet population increases further, the ST quenching term in (8) causes the derivative of singlet population to be negative and thus the decrease of singlet population.

From Table. 1, it can be seen that ST quenching rates are approximately the same in a given guest host combination regardless of doping concentration. This is expected because ST quenching is a long range dipole-dipole interaction which only depends on the absorption of the acceptor (triplet) and the emission of the donor (singlet). Since the turn-on peak is not observed in undoped OLEDs with Alq₃ or ADN as EML, this interaction may be identified as quenching of guest singlet by host triplet. The almost half decrease in TP quenching rate from 3% TBP:ADN to 8% TBP:ADN is likely because TBP sites can act as triplet or polaron traps, which decrease the triplet polaron collision probability. It is worth pointing out that our value for DCM:Alq₃ ST quenching rate is very close to values obtained previously from purely optical excitation measurement: (1.9×10⁻¹⁰ cm³/s), from Giebink, N.C. and S. R. Forrest, Phys. Rev. B, 2009, 79(7): p. 073302.

Previously, the same turn-on feature in a similar device structure was observed by Ma and coworkers, Ma, C. W., O. Lengyel, J. Kovac, I. Bello, C. S. Lee, and S.T. Lee, Chemical Physics Letters, 2004, 397(1-3): p. 87, and attributed to the recombination between injected holes and pre-trapped electrons on dopants. According to their proposed model, emission in the first 20 µs due to trapped electrons accounts for approximately ⅙ of the total emission; the trapped electron population can be calculated from current density as approximately 4×10¹⁸/cm³ over the entire doped region. Considering the small number of intrinsic charges in organic semiconductor, it is difficult to understand the origin of such high density of trapped electrons. Moreover, since the turn-on of the EL is associated with the electron transit time through the ETL, if injected holes can recombine with pre-trapped electrons, the EL turn-on delay in a doped device should be shorter than in an undoped one, which was not observed in their report. In another treatment, by simulating the charge injection, transit, and recombination, Ruhstaller et al., Selected Topics in Quantum Electronics, IEEE Journal of 2003. 9(3): p. 723, explained the EL turn-on overshoot in an undoped OLED by the temporal imbalance of charges in the EML. However, their theory is not applicable for our devices since the EL peak to steady state ratio from their model (about 1.2) is much smaller than observed in our experiment (about 2) and does not correctly predict the double pulse peak recovery time discussed in the following section.

4.2 Double Pulses Peak Recovery

In the double pulse peak recovery measurement, two voltage pulses separated by a time delay are applied on the OLEDs. This technique is typically adopted to study the recovery of the peak as a function of delay between the two pulses. A negative baseline voltage (−4V) was used in our experiment to reduce the effect of residual charges.

Figure 4:
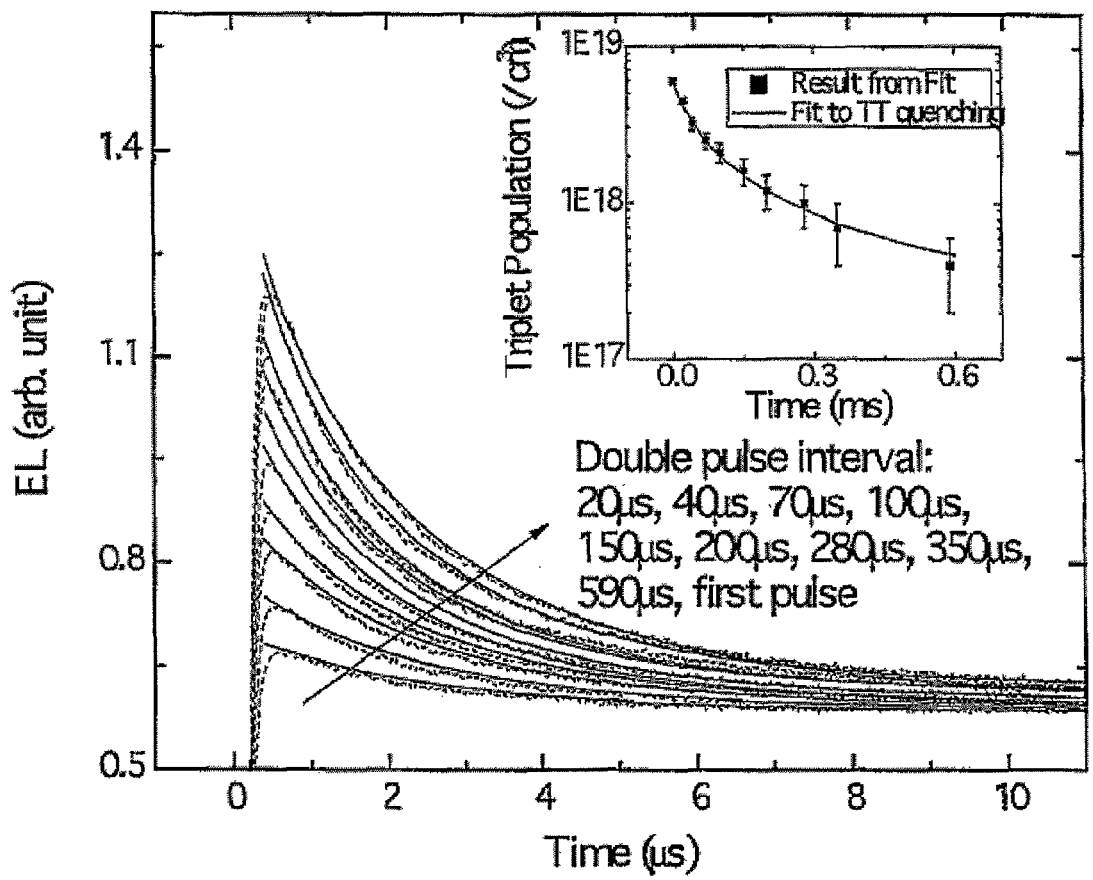
FIG. 4 shows the recovery of turn-on peaks when two adjacent pulses of different intervals are applied.

One example is shown in FIG. 4 for device B2. It can be seen that more than 600 µs delay time is necessary for the full recovery of the turn-on peak. In our model, time required for the recovery of the EL turn-on peak can be readily explained by the relaxation of triplet population. When the double pulse delay is short compared to triplet decay time, triplet population remains large at the beginning of the second pulse and effective ST quenching suppresses the height of the turn-on peak. By fitting the EL peak during the second pulse as a function of second pulse delay, triplet population dynamics can be predicted.

The triplet population decay should follow (6), where the generation term is zero when the voltage is turned off if residual charges can be neglected. Therefore, the TP quenching term in (6) becomes zero and triplet relaxation follows either triplet non-radiative decay, or TT quenching, or both. Triplet diffusion through the ETL or HTL is not likely since triplet energies of NPD (2.29 eV) and BAlq (2.18 eV) are higher than triplet energies of Alq₃ (2.03 eV) and ADN (about 1.8 eV) [8, 27, 28], which confines the triplets in the EML of the OLEDs.

By fitting the triplet population using (6) (FIG. 6 Inset) for device B2, it is found that it follows TT quenching, with a quenching coefficient of 3.3×10⁻¹⁵ cm³/s. Now, we can go back and check whether our previous neglect of TT quenching in section 4.1 is valid. If we use the condition in FIG. 3, where the steady state polaron and triplet populations are 3.5×10¹⁷/cm³ and 5.8×10¹⁸/cm³ respectively, the net TP quenching, $k_{TP}$nT* (1.5×10²⁴/cm³/s) is an order of magnitude larger than the net TT quenching, (⁵⁄₄) $k_{TT}$T*² (1.3×10²³/cm³/s). Thus, the approximation in section 4.1 is justified. Similar process is carried out in device A1, which yields a TT quenching rate of 2.4×10¹⁵ cm³/s.

Figure 5:
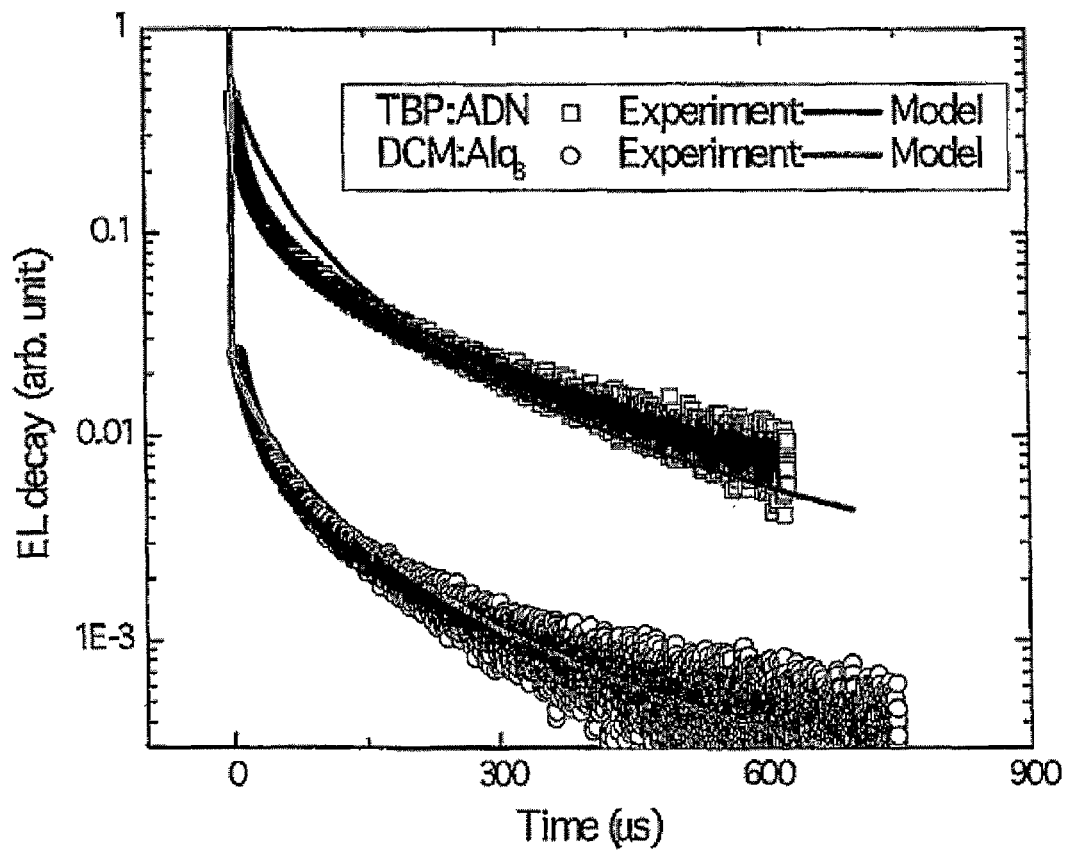
FIG. 5 shows delayed fluorescence from two devices after a voltage pulse is turned off.

In presence of TT quenching, delayed fluorescence (DFL) is expected from (1), which is shown in FIG. 5. Using the extracted TT quenching rate (2.4×10⁻¹⁵ cm³/s and 3.3×10¹⁵ cm³/s for A1 and B2 respectively), the DFL is predicted and shown in FIG. 5. The deviation between predicted and measured DFL may be due to the effect of residual charges.

4.3 Steady State Quantum Efficiency

Figure 6:
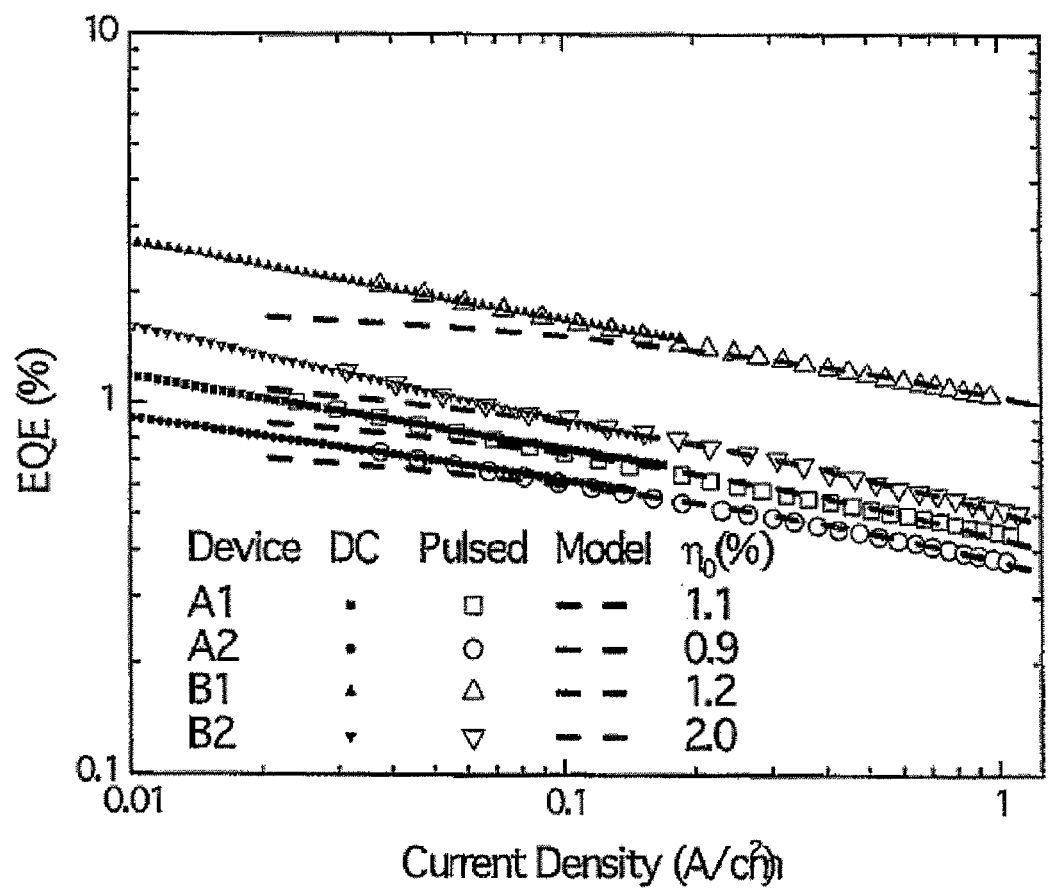
FIG. 6 shows DC and pulsed EQE (external quantum efficiency) for four devices.

With extracted parameters in Table. 1, we can use (4), (6), (8) to calculate the steady state EQE as a function of current density. If we neglect the TT annihilation and triplet non-radiative decay in (6) as in section 4.1, $$n(J) = \frac{n_0}{1 + \frac{3k_{ST}}{4k_S k_{TP}}\sqrt{\frac{J\gamma}{ed}}}, \quad (10)$$

where the scaling factor $n_0$ is the EQE when J=0. Since the parameters $k_{ST}$, $k_{TP}$ and $\gamma$ in Table 1 are extracted for the current density range 0.1-1 A/cm², we calculate $n_0$ for J=0.5 A/cm². The result of both measured and predicted EQE is shown in FIG. 6.

EQE from the pulsed measurement at the end of 100 µs voltage pulses overlaps the DC measurement with 17 ms integration time at the same current density. This suggests device heating does not affect EQE at the DC current density range used (below 0.1 A/cm$^2$). The predicted EQE overlaps measured EQE only in the current density range 0.1-1 A/cm$^2$, which is the fitting range in section 4.1. Two reasons may contribute to this deviation: field dependent mobility and additional roll-off mechanism. If the mobility decreases with electric field in lower voltage (corresponding to J<0.1 A/cm$^2$), the Langevin recombination rate calculated from (5) may be overestimated, which causes an underestimate of EQE below 0.1 A/cm$^2$ according to (10). Second, if other roll-off mechanisms such as singlet-polaron quenching and charge imbalance are effective, the relative EQE decrease would be much faster than predicted by ST quenching alone; thus the zero current EQE $n_0$ is underestimated, which also causes an underestimate of EQE of 0.1 A/cm$^2$.

Although the ST quenching model does not reproduce the measured EQE roll-off in the entire current density range, it is an active quenching mechanism at high current density in the fluorescent OLEDs studied as evident from the EL transient as well as the predicted EQE roll-off.

FIG. 1 shows the transient response of device A1 to a 12.5V rectangular pulse with 100 μs pulse width. The initial and final current (black solid line) overshoots lasting around 0.5 μs is due to the RC response of the circuit. The EL (dashed line) overshoots to a peak value in 0.7 μs and slowly decays to a steady state in 20 μs.

FIG. 2 shows transient EL (dashed lines) from device A1 (a) and B2 (b) in response to 100 μs voltage pulses of different amplitudes. The current density shown is the steady state current density at the end of the pulse. Black solid lines are the fits to the ST quenching model, which determine the quenching rate of $1.9 \times 10^{-10}$ cm$^3$/s and $1.2 \times 10^{-10}$ cm$^3$/s for A1 and B2 respectively. Similar fittings are obtained for all four devices and the results are summarized in Table. 1.

FIG. 3 shows simulated population dynamics of device B2 for 0.8 A/cm$^2$ steady state current density. The EL intensity is proportional to singlet population.

FIG. 4 shows recovery of the turn-on peaks (dashed lines) when two adjacent pulses of different intervals are applied. All pulses are of 12V amplitude and 100 μs width. The fittings are obtained through the ST quenching model described herein. All physical constants are from Table. 1, and the triplet populations immediately before the pulses can be extracted (Inset). The inset shows fitted triplet population as a function of time following the turn-off of the OLED. This population decay can be fitted with a TT quenching model, which yields a quenching rate of $3.3 \times 10^{-15}$ cm$^3$/s.

FIG. 5 shows delayed fluorescence from device A1 and B2 after the turn-off of 12V voltage pulse with 100 μs width. The oscilloscope is triggered at t=0 by the falling edge of the voltage pulse and the EL decay is scaled so that steady state EL during the pulse is 1 for A1 and 10 for B2. Solid lines give the predicted EL decay by (6) with n quenching rate of $2.4 \times 10^{-15}$ cm$^3$/s and $3.3 \times 10^{-15}$ cm$^3$/s for A1 and B2 respectively from double pulse recovery measurement.

FIG. 6 shows DC and pulsed EQE for all the four devices. Pulsed EQE is measured at the end of a 100 μs voltage pulse. Dashed lines are the predicted steady EQE from the model given in section 2 and parameters extracted in section 4.1.

Table. 1 shows result of the fittings to ST quenching model for the current density range between 0.1 A/cm$^2$ and 1 A/cm$^2$. Singlet lifetime $\tau_S$ is from the PL transient measurement on 50 nm doped film. Mobility is approximately determined from the turn-on delay of the device by (9). TP quenching rate and ST quenching rate are extracted from the fitting.

TABLE 1

| EML | $\tau_S$ (ns) | $k_{TP}$ (cm$^3$/s) | $k_{TS}$ (cm$^3$/s) | d (nm) | μ (cm$^2$/(V/s)) |
|---|---|---|---|---|---|
| 3% DCM:Alq$_3$ | 1.2 ± 0.1 | (5.6 ± 0.4) × 10$^{-13}$ | (1.9 ± 0.2) × 10$^{-10}$ | 25 | (1.2 ± 0.2) × 10$^{-5}$ |
| 8% DCM:Alq$_3$ | 1.1 ± 0.1 | (6.3 ± 0.5) × 10$^{-13}$ | (1.8 ± 0.2) × 10$^{-10}$ | 25 | (1.2 ± 0.2) × 10$^{-5}$ |
| 3% TBP:ADN | 2.3 ± 0.1 | (13 ± 0.2) × 10$^{-13}$ | (1.1 ± 0.2) × 10$^{-10}$ | 25 | (1.6 ± 0.3) × 10$^{-5}$ |
| 8% TBP:ADN | 2.1 ± 0.1 | (7.4 ± 0.3) × 10$^{-13}$ | (1.2 ± 0.1) × 10$^{-10}$ | 25 | (1.6 ± 0.3) × 10$^{-5}$ |

Several molecules that are particularly preferred for use as an organic dopant compound (triplet sink) include anthracene, tetracene, rubrene, and perylene. Derivatives of these molecules are also preferred. The relevant common characteristics of these molecules are that their triplet energies are relatively low (<1.7 eV), and they have large singlet triplet energy splitting. Large singlet-triplet energy splitting means that the singlet energy is significantly greater than the triplet energy, by an amount that does not occur in many molecules. Preferably, the singlet energy is at least twice the triplet energy. These molecules were used in device structures described herein. The normally transient turn-on peaks were maintained, and the steady state external quantum efficiencies of the devices with triplet sinks were surprisingly about twice the value of devices without triplet sinks. Moreover, the external quantum efficiencies were significantly higher than those for other devices with triplet sinks described in other embodiments herein. Therefore, these molecules, and other molecules with similar properties, are particularly preferred for use as triplet sinks in fluorescent organic light emitting devices at high intensity. Many of the phosphors described herein for use as triplet sinks resulting in devices that were able to maintain the normally transient turn-on peaks, but were not able to enhance the external quantum efficiency to the same extent as the triplet sinks with relatively low (<1.7 eV) triplet energies and large singlet triplet energy splitting.

Figure 7:
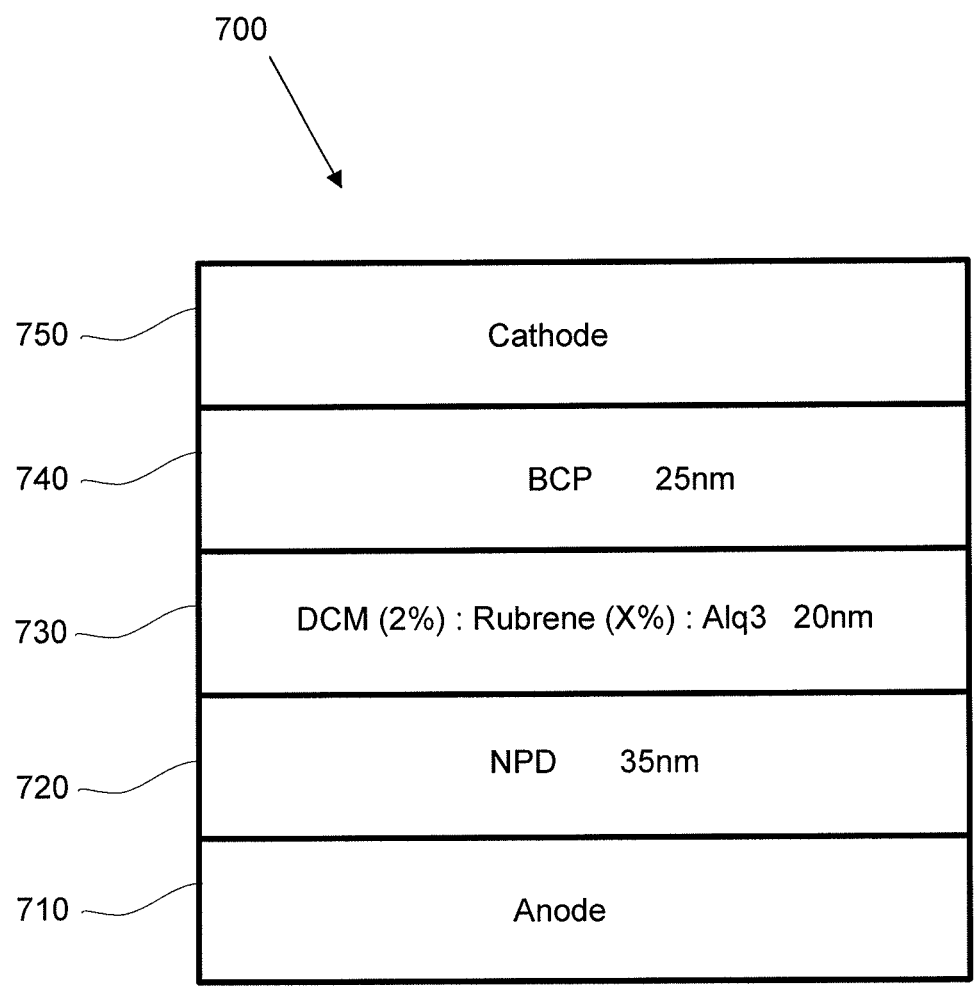
FIG. 7 shows a device structure that was fabricated using a particularly preferred device architecture.

FIG. 7 shows a device structure that was fabricated using a particularly preferred device architecture having an emissive layer with a triplet sink, where the triplet sink molecule has a relatively low triplet energy (<1.7 eV) and large singlet-triplet energy splitting as described above. Device 700 included an anode 710, a hole transport layer 720, an emissive layer 730, an electron transport layer 740 and a cathode 750. Hole transport layer 720 was a 35 nm thick layer of NPD. Emissive layer 730 was a 20 nm thick layer of Alq$_3$ doped with 2% DCM as an organic emitting compound capable of fluorescent emission, and X % rubrene as an organic dopant that acts as a triplet sink. Percentages herein are by weight (wt %) unless otherwise specified. Devices were fabricated with X=0, 5, 20, 40 and 98%. Electron transport layer 740 was a 25 nm thick layer of BCP. The device illustrated in FIG. 7, except as specifically otherwise noted, was used to generate the date of FIGS. 1-6. The device structure of FIG. 7, but using 4-(dicyanomethylene)-2-methyl-6-julolidyl-9-enyl-4H-pyran (DCM2) instead of DCM, and except as specifically otherwise noted, was used to generate the data illustrated in FIGS. 8-11.

Figure 8:
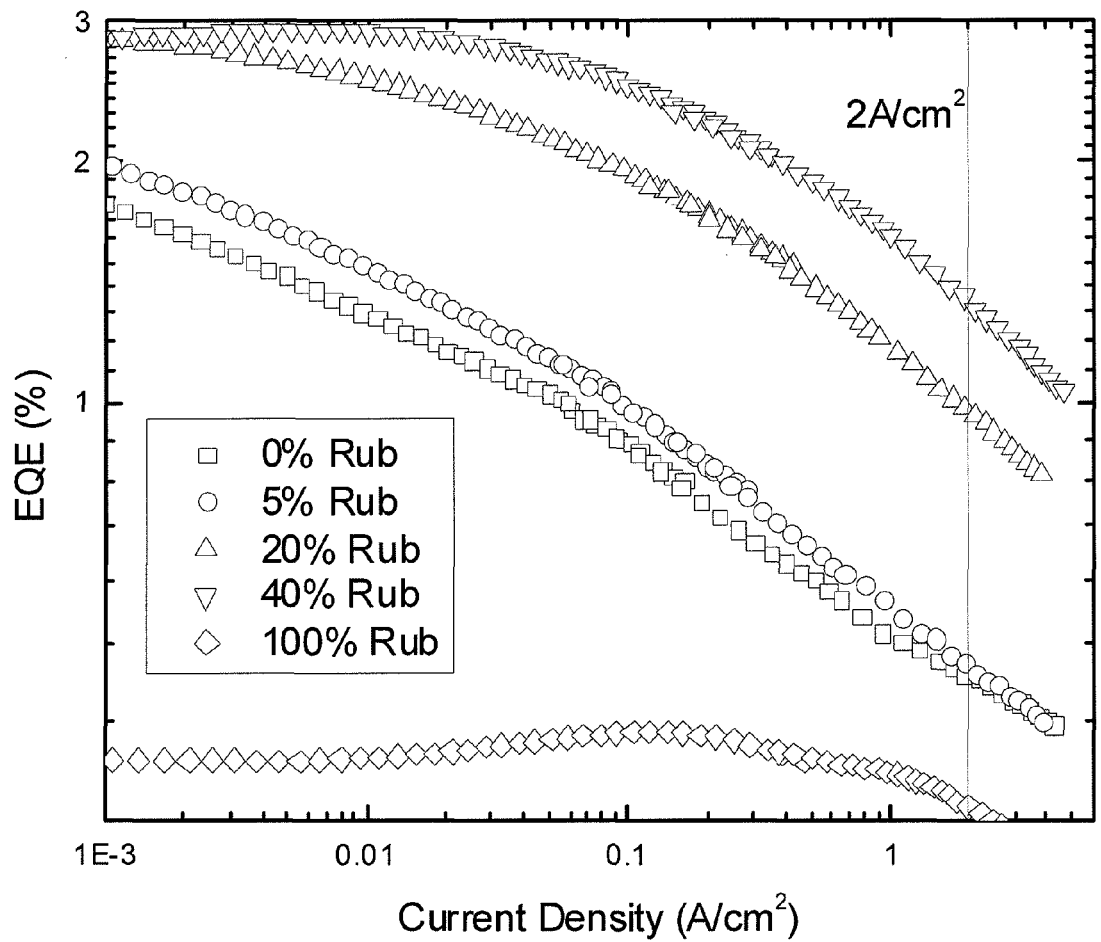
FIG. 8 shows, for the devices of FIG. 7, external quantum efficiency as a function of current density.

FIG. 8 shows, for the devices of FIG. 7, external quantum efficiency as a function of current density. It can be seen that external quantum efficiency increases with increasing rubrene concentration up to at least 40% rubrene.

Figure 9:
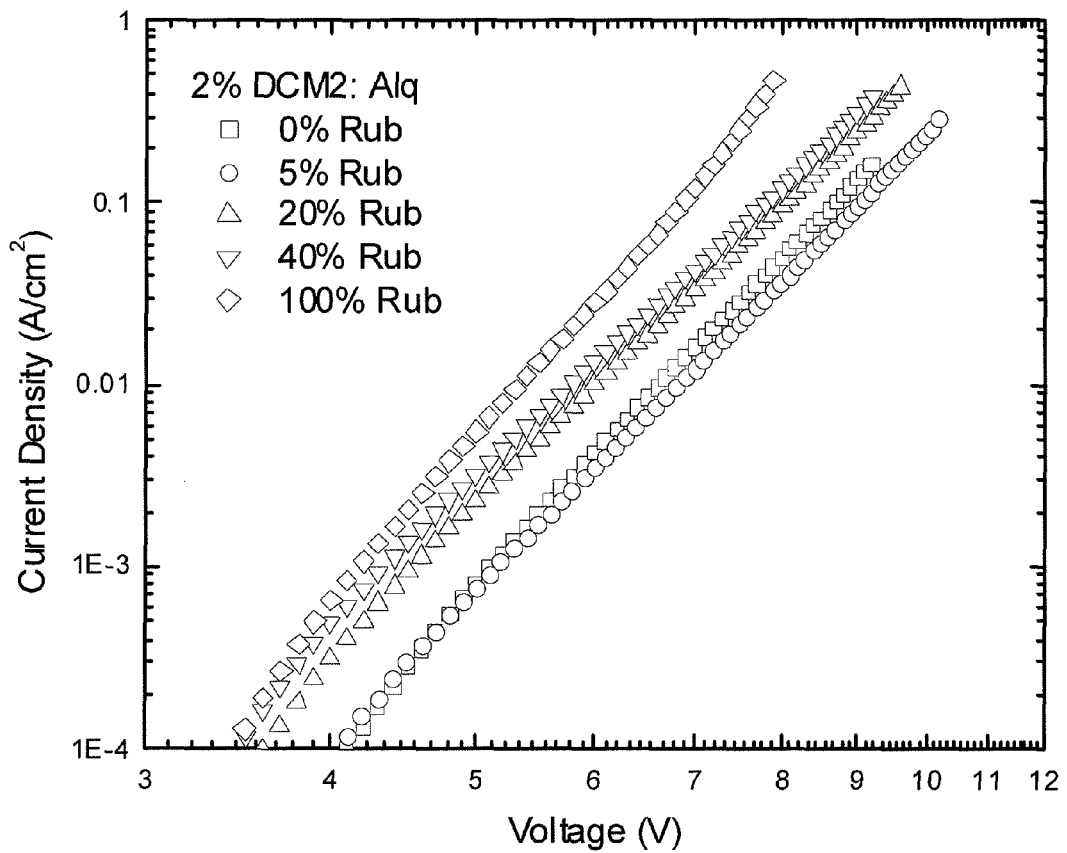
FIG. 9 shows the current density—voltage relationship for the devices of FIG. 7.

FIG. 9 shows the current density—voltage relationship for the devices of FIG. 7. The devices all had the same spectrum, except for the 100% rubrene device.

Figure 10:
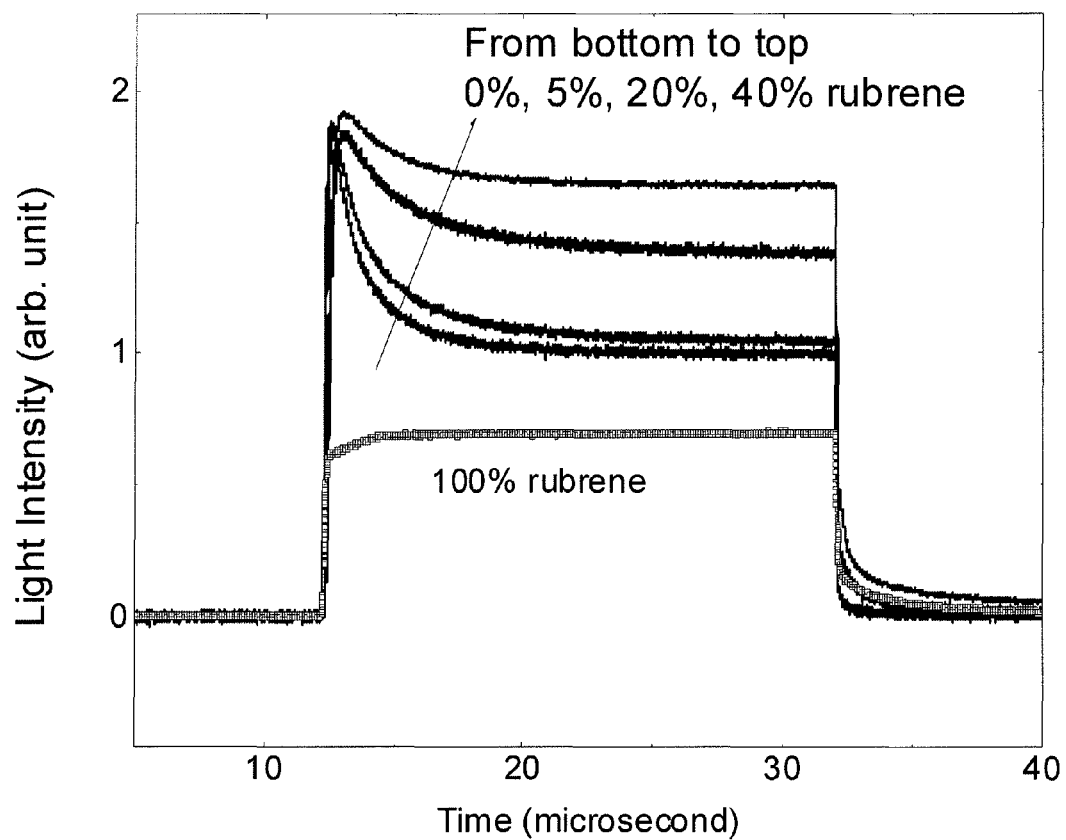

FIG. 10 shows light output as a function of time after the devices of FIG. 7 are turned on. It can be seen from FIG. 10 that the devices better maintain the transient turn-on peak as rubrene percentage increases up to at least 40% rubrene. It is expected that other dopant molecules having triplet energies and singlet-triplet energy splitting similar to rubrene will show results similar to those illustrated in FIGS. 7-10 for devices using rubrene as a dopant molecule.

Figure 11:
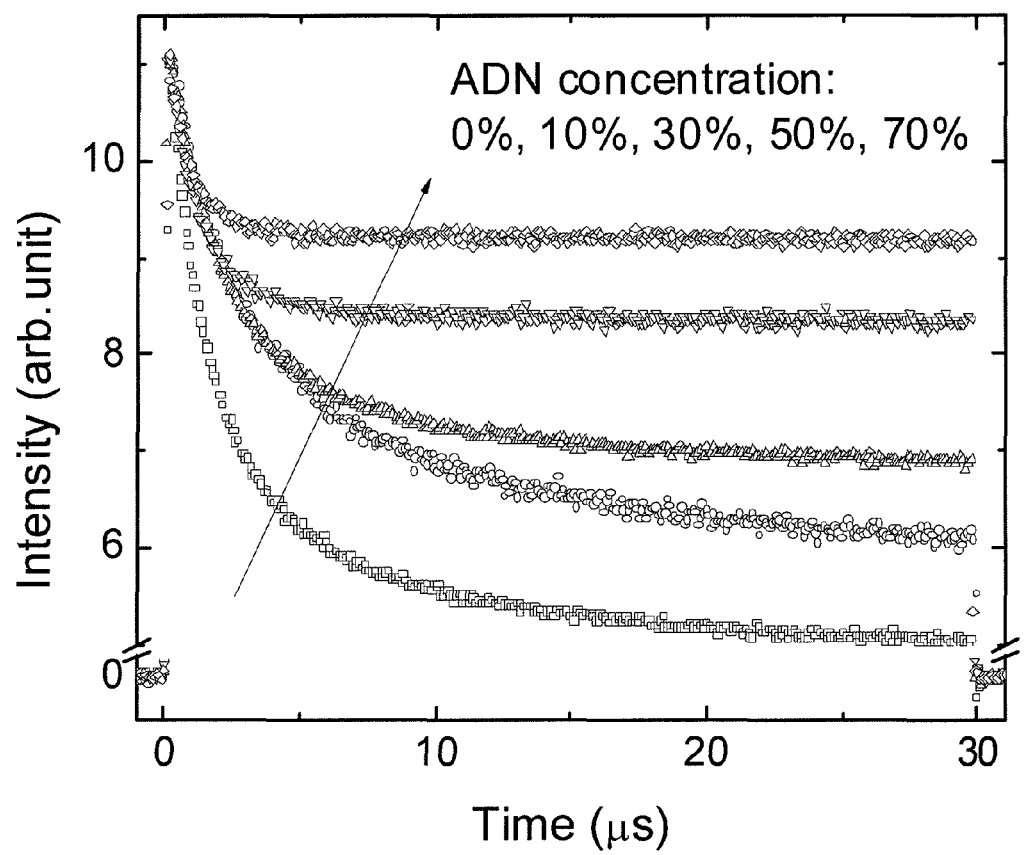
FIG. 11 shows photoluminescent light output as a function of time for films with various ADN concentrations.

FIG. 11 shows photoluminescent light output as a function of time for films with various ADN concentrations. The films were a Alq/DCM2 (host/emissive compound) system with different concentrations of ADN dopant compound, ranging from 0 wt % to 70 wt % ADN. The photoluminescent transients were measured using a biased Si photo-detector on 200 nm of organic thin films vacuum evaporated on Si substrate. The films were pumped by a 405 nm laser diode at 1.6 kW/cm$^2$ intensity. As the ADN concentration increases from 0% to 70%, the intensity is seen to remain at a higher level over time. The bottom curve is from the film with 0% ADN. The sequentially increasing intensity of the other curves corresponds to increases in ADN concentration to 10%, 30%, 50% and 70%. The top curve is from the film with 70% ADN. The films show decreased transient quenching with increasing ADN concentration.

5. CONCLUSIONS

EL turn-on peaks in doped fluorescent OLEDs are observed and quantitatively explained by the ST quenching model developed. The EL transients of DCM:Alq$_3$ and TBP:ADN OLEDs with different doping concentrations are fitted in the current density range between 0.1 A/cm$^2$ and 1 A/cm$^2$. The ST quenching rate is found to be independent of doping concentration, which confirms the long range nature of this interaction. By studying the recovery of the peak using two pulses driving mode, triplet population decay is found to follow the TT quenching in around 500 µs after the device turn-off Steady state EQE of the OLEDs can be described by the model developed in the current density range between 0.1 A/cm$^2$ and 1 A/cm$^2$, however, at lower current density, the model may underestimate EQE since it is oversimplified. However, this should not affect the general conclusions that may be drawn.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

A preferred use of devices fabricated in accordance with embodiments of the invention is use for general illumination purposes, such as white light having a high CRI (color rendering index) and CIE coordinates corresponding to light that appears white to a viewer. Phosphorescent OLED technology is generally more efficient than fluorescent OLED technology, and as such phosphorescent OLED technology is preferred over fluorescent OLED technology for general illumination purposes, where reducing power consumption is highly desirable. However, there are still issues with blue-emitting phosphorescent OLEDs, such as low lifetimes, that have been solved for (generally) lower efficiency fluorescent blue OLED devices. The most desirable light sources for general illumination purposes for many applications have a high CRI that requires a significant blue component. Fluorescent OLED devices using a triplet sink as described herein may have better efficiencies than regular fluorescent devices, and are highly desirable for use as the blue component in a white light source. Fluorescent OLED devices using a triplet sink as described herein may also be used for other color components, but may not be as preferred because phosphorescent OLED devices perform well in regions of the visible spectrum other than blue. Similarly, fluorescent OLED devices using a triplet sink as described herein may be used in other types of devices, such as displays and other consumer products, and may be particularly preferred for use as the blue component of such devices.

A first device is provided. The first device further comprises an organic light emitting device. The organic light emitting device further comprises an anode, a cathode, and an emissive layer disposed between the anode and the cathode. The emissive layer further comprises an organic host compound, an organic emitting compound capable of fluorescent emission at room temperature, and an organic dopant compound. The triplet energy of the dopant compound is lower than or equal to the triplet energy of the host compound. The triplet energy of the organic dopant compound is lower than or equal to the triplet energy of the organic emitting compound. The singlet energy of the organic emitting compound is lower than the singlet energy of the organic host compound. The singlet energy of the organic emitting compound is lower than the singlet energy of the organic dopant compound. The dopant compound does not strongly absorb the fluorescent emission of the emitting compound.

The first device preferably further includes a hole transport layer disposed between the emissive layer and the anode, and an electron transport layer disposed between the emissive layer and the cathode. The organic dopant compound is preferably present only in the emissive layer.

By stating that the dopant compound "does not strongly absorb" the fluorescent emission of the emitting compound, it is meant that the ground, singlet excited and triplet-triplet excited states all have low absorption of the spectrum emitted by the fluorescent emitting compound. One of skill in the art can ascertain whether there is low absorption by observing plots of the emission and absorption spectra on the same graph, and checking whether there is significant overlap—some small overlap in the tail regions is permissible. To quantify, a Forster transfer radius may be calculated from the emission and absorption spectrum. Lower Forster transfer radii correspond to lower absorption and less overlap in the spectra as described. Preferably, the Forster transfer radius for transfer from the emitting compound to the dopant compound is less than 0.7 nm, more preferably less than 0.3 nm.

The first device preferably further includes a hole transport layer disposed between the emissive layer and the anode, and an electron transport layer disposed between the emissive layer and the cathode. The organic dopant compound is preferably present only in the emissive layer.

Preferably, the transport gap of the dopant compound is no less than the transport gap of the host compound.

Preferably, the mobility of the dopant compound is higher than the mobility of the host compound.

Preferably, the triplet decay time of the dopant compound is shorter than the triplet decay time of the emitting compound.

Preferably, the first device further comprises an outcoupling enhancement structure adapted to increase the amount of light outcoupled from the first device by at least 25%, and more preferably by at least 50%, relative to a device having no outcoupling enhancement structure. Outcoupling enhancement structures are well known, and may include:
nanopatterning of a glass substrate—50% increase in amount of light outcoupled reported in Gu, et. al, Opt. Lett., 22, 396 (1997)
microlens array—80% increase in amount of light outcoupled reported in Moller et. al, J. Appl. Phys., 91, 3324 (2001)
silica aerogels—80% increase in amount of light outcoupled reported in T. Tsutsui et. al, Advanced Materials, 13, 1149 (2001)
shaped substrates—90% increase in amount of light outcoupled reported in Madigan et. al, Appl. Phys. Lett., 76, 1650, (2000)
low index grid—31% increase in amount of light outcoupled reported in Slootsky et. al, Appl. Phys. Lett., 94, 163302 (2009)
One or more outcoupling enhancement structures may be combined to result in a total enhancement as described.

Preferably, the concentration of the dopant compound is 10%-90%, and the concentration of the emitting compound is 0.5%-5%. Concentrations outside of these ranges may be used or preferred for some applications.

It is preferable to maximize the transfer of singlets from the host and dopant to the emitting compound. The co-system of host and dopant (without an emitting compound) may have different emission spectra for different dopant concentrations. For an optimized concentrations, the overlap between this emission spectra and the guest absorption spectrum is maximized. The result of such maximization is increased or possibly complete singlet transfer to the emitting compound. This is a more detailed condition than the condition that the singlet energy of the emitting compound is simply less than the singlet energy of the host and the singlet energy of the dopant.

It is preferable to maximize the transfer of triplets from the host and the emitting compound to the dopant. A higher dopant concentration will result in more efficient triplet transfer from the emitting compound and the host to the dopant. This is a more specific condition than the condition that the triplet energy of the dopant is less than or equal to the triplet energy of the host and the emitting compound. However, if the dopant concentration is too high, transfer of singlets to the emitting compound may be compromised. Also, too high a dopant concentration can result in faster device degradation.

It is also preferable to select concentrations of the emitting compound, the host and the dopant that result in the highest emitting layer mobility.

In some embodiments, the triplet energy of the dopant compound is preferably greater than 1.3 eV, and more preferably greater than 1.6 eV. 130 kJ/mol is around 1.3 eV If the triplet energy of the host material is sufficiently high, the triplet sink dopant triplet energy may also be high. For example, anthracene (1.6 eV triplet exciton) as a triplet sink in $Alq_3$ is an example. The use of high energy materials as described herein enables hosts that are capable of supporting high energy fluorescent emitters, such as blue-emitting emitters. Because OLED technology is generally weaker for blue emitters, the use of high energy hosts and triplet sinks to improve the performance of blue-emitting fluorescent devices is a particularly desirable result. In a particularly preferred embodiment, the triplet energy of the dopant compound is at least 1.3 eV, preferably at least 1.6 eV, and not more than 1.7 eV for the reasons described herein.

Preferably, the organic light emitting device has a turn-on peak that is at least 50% reduced relative to an otherwise equivalent device that omits the dopant compound. More preferably, the organic light emitting device does not have a turn-on peak.

Preferably, the organic emitting compound is capable of fluorescent emission at room temperature.

Preferably, the dopant compound has a triplet energy less than 1.7 eV, and has a singlet energy that is at least twice the triplet energy.

Preferably, the dopant compound is selected from the group consisting of: anthracene, tetracene, rubrene, and perylene and their derivatives.

In some embodiments, the dopant compound may be a phosphor.

In some embodiments, the first device is a consumer product.

Preferably, the triplet manager increases the total mobility of the emitting layer. This results in decreased OLED voltage when injecting the same amount of current density.

Preferably, various considerations are balanced. Several considerations in selecting materials and concentrations are:
 lower operating voltage compared to OLED without the dopant
 higher quantum efficiency compared to OLED without the dopant at the same current density
 decreased electroluminescence transient quenching compared to OLED without the dopant
 similar emission spectrum to OLED without the dopant
The optimized concentration value may be different for different guest-host/manager combination. For the DCM2 (emissive compound)-$Alq_3$ (host)/rubrene(dopant) system, the optimized concentration of rubrene is 50%-70%. For the DCM2 (emissive compound)-$Alq_3$ (host)/ADN (dopant) system, the optimized concentration of ADN is 60%-80%. Note that even at non-optimized dopant concentrations, the device efficiency is enhanced relative to a device without the dopant.

A method is provided. The method is practiced using a first device that further comprises an organic light emitting device. The organic light emitting device further comprises an anode, a cathode, and an emissive layer disposed between the anode and the cathode. The emissive layer further comprises an organic host compound, an organic emitting compound capable of fluorescent emission at room temperature, and an organic dopant compound. The triplet energy of the dopant compound is lower than or equal to the triplet energy of the host compound. The triplet energy of the organic dopant compound is lower than or equal to the triplet energy of the organic emitting compound. The singlet energy of the organic emitting compound is lower than the singlet energy of the organic host compound. The singlet energy of the organic emitting compound is lower than the singlet energy of the organic dopant compound. The dopant compound does not strongly absorb the fluorescent emission of the emitting compound. An operating voltage is applied across the anode and the cathode. The concentration of the dopant compound is sufficient to reduce the turn-on peak of the organic light emitting device by at least 50% relative to an otherwise equivalent device that omits the dopant compound. Preferably, the organic light emitting device does not have a turn-on peak.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works, and modeling of specific configurations, are not intended to be limiting.

The invention claimed is:

1. A first device, further comprising:
an organic light emitting device, further comprising:
an anode;
a cathode; and
an emissive layer disposed between the anode and the cathode, the emissive layer further comprising:
an organic host compound;
an organic emitting compound capable of fluorescent emission; and
an organic dopant compound;
wherein:
the triplet energy of the organic dopant compound is lower than or equal to the triplet energy of the organic host compound;
the triplet energy of the organic dopant compound is lower or equal to than the triplet energy of the organic emitting compound;
the singlet energy of the organic emitting compound is lower than the singlet energy of the organic host compound;
the singlet energy of the organic emitting compound is lower than the singlet energy of the organic dopant compound; and
the organic dopant compound does not strongly absorb the fluorescent emission of the organic emitting compound; and
wherein, the triplet energy of the dopant compound is greater than 1.6 eV.

2. The first device of claim 1, wherein the organic light emitting device further comprises:
a hole transport layer disposed between the emissive layer and the anode; and
an electron transport layer disposed between the emissive layer and the cathode;
wherein the organic dopant compound is present only in the emissive layer.

3. The first device of claim 1, wherein the transport gap of the dopant compound is no less than the transport gap of the host compound.

4. The first device of claim 1, wherein the mobility of the dopant compound is higher than the mobility of the host compound.

5. The first device of claim 1, wherein the triplet decay time of the dopant compound is shorter than the triplet decay time of the emitting compound.

6. The first device of claim 1, wherein the first device further comprises an outcoupling enhancement structure adapted to increase the amount of light outcoupled from the first device by at least 25% relative to a device having no outcoupling enhancement structure.

7. The first device of claim 1, wherein:
the concentration of the dopant compound is 10 wt %-90 wt %;
the concentration of the emitting compound is 0.5 wt %-5 wt %.

8. The first device of claim 1, wherein the organic light emitting device does not have a turn-on peak.

9. The first device of claim 1, wherein the organic light emitting device has a turn-on peak that is at least 50% reduced relative to an otherwise equivalent device that omits the dopant compound.

10. The first device of claim 1, wherein the organic emitting compound is capable of fluorescent emission at room temperature.

11. The first device of claim 1, wherein the dopant compound has a triplet energy less than 1.7 eV, and has a singlet energy that is at least twice the triplet energy.

12. The first device of claim 1, wherein the dopant compound is selected from the group consisting of: anthracene, tetracene, and their derivatives.

13. The first device of claim 1, wherein the dopant compound is a phosphor.

14. The first device of claim 1, wherein the first device is a consumer product.

15. A method, comprising:
providing a first device, further comprising an organic light emitting device, the organic light emitting device further comprising:
an anode;
a cathode;
an emissive layer disposed between the anode and the cathode, the emissive layer further comprising:
an organic host compound;
an organic emitting compound capable of fluorescent emission;
an organic dopant compound;
wherein:
the triplet energy of the organic dopant compound is lower than or equal to the triplet energy of the organic host compound;
the triplet energy of the organic dopant compound is lower or equal to than the triplet energy of the organic emitting compound;
the singlet energy of the organic emitting compound is lower than the singlet energy of the organic host compound;
the singlet energy of the organic emitting compound is lower than the singlet energy of the organic dopant compound;
the organic dopant compound does not strongly absorb the fluorescent emission of the organic emitting compound; and
the triplet energy of the dopant compound is greater than 1.6 eV;
applying an operating voltage across the anode and the cathode;
wherein the concentration of the dopant compound is sufficient to reduce the turn-on peak of the organic light emitting device by at least 50% relative to an otherwise equivalent device that omits the dopant compound.

16. The method of claim 15, wherein the organic light emitting device does not have a turn-on peak.

17. The first device of claim 1, wherein the dopant compound comprises ADN having a concentration of between 60 wt %-80 wt %.

18. The method of claim 15, wherein the dopant compound has a triplet energy less than 1.7 eV, and has a singlet energy that is at least twice the triplet energy.

* * * * *